United States Patent [19]

Jakob et al.

[11] Patent Number: 5,272,593
[45] Date of Patent: Dec. 21, 1993

[54] HOUSING FOR AN ELECTRONIC CIRCUIT WITH IMPROVED HEAT DISSIPATION MEANS

[75] Inventors: Gert Jakob, Stuttgart; Karl Schupp, Pforzheim; Dieter Hussmann, Steinheim; Thomas Jessberger, Eberdingen/Hochdorf; Dieter Karr, Tiefenbronn, all of Fed. Rep. of Germany

[73] Assignee: Robert Bosch GmbH, Stuttgart, Fed. Rep. of Germany

[21] Appl. No.: 941,068

[22] PCT Filed: May 25, 1991

[86] PCT No.: PCT/DE91/00440
§ 371 Date: Oct. 8, 1992
§ 102(e) Date: Oct. 8, 1992

[87] PCT Pub. No.: WO92/00660
PCT Pub. Date: Jan. 9, 1992

[30] Foreign Application Priority Data

Jun. 29, 1990 [DE] Fed. Rep. of Germany ... 9007236[U]

[51] Int. Cl.⁵ .............................................. H05K 7/20
[52] U.S. Cl. ..................................... 361/707; 257/713; 361/736
[58] Field of Search ............... 165/80.3, 185; 361/395, 361/399, 382, 413, 386–389; 174/16.3; 257/706, 707, 712, 713, 718, 719, 722; 267/150, 160

[56] References Cited

U.S. PATENT DOCUMENTS

| 4,204,248 | 5/1980 | Proffit | 361/388 |
| 4,298,905 | 11/1981 | Bosler | 361/388 |
| 5,089,936 | 2/1992 | Kojima | 361/387 |
| 5,170,325 | 12/1992 | Bentz | 361/388 |

FOREIGN PATENT DOCUMENTS

| 373434 | 6/1990 | European Pat. Off. . | |
| 2546334 | 4/1977 | Fed. Rep. of Germany . | |
| 2328353 | 5/1977 | France . | |
| 2167906 | 3/1985 | United Kingdom | 361/386 |

OTHER PUBLICATIONS

Semi-Conductor Module with Heat Transfer, IBM Tech Discl Bull vol. 20 No. 12 May 1978, Eckenbach et al, p. 5203.
WO, A, 9105453 of 18 Apr. 1991.

Primary Examiner—Gerald P. Tolin
Attorney, Agent, or Firm—Michael J. Striker

[57] ABSTRACT

The housing for an electronic circuit is box-shaped, and on each of its longitudinal sides in its interior has a shoulder (44, 45), and above each of those a ridge (47, 48) and -- extending along a longitudinal side. A cooling frame (11) is pushed into the grooves (52, 53) formed between shoulder and ridge, with a printed circuit board (10) being fixed to the underside of the cooling frame. In its interior, the cooling frame has cooling tabs (15, 16, 17) which stand perpendicular to the surface of the printed circuit board and on which power components (20) are fixed.

5 Claims, 1 Drawing Sheet

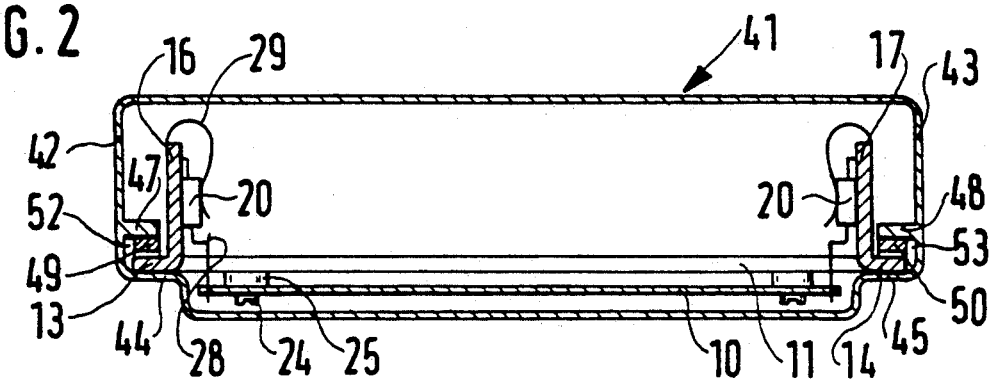

HOUSING FOR AN ELECTRONIC CIRCUIT WITH IMPROVED HEAT DISSIPATION MEANS

BACKGROUND OF THE INVENTION

The invention relates to a housing for an electronic circuit. A housing of this type is known from DE-PS 25 46 334. The housing has an interior cooling frame on which a printed circuit board is fixed. The cooling frame has chambers, and a base located above the printed circuit board, which accommodate the components which are heated to a significant extent. The construction of the housing, in particular that of the cooling frame is somewhat complicated since the cooling frame has a special shape. For this reason, this arrangement is comparatively expensive. Moreover, improved heat dissipation of heat generated in the power components is needed, since the thermal conduction paths are relatively long.

SUMMARY OF THE INVENTION

It is an object of the present invention to provide a housing for an electronic circuit with improved heat dissipation means.

According to the invention, the housing for an electronic circuit comprises a cooling frame having means for attachment (e.g. screws) of a printed circuit board (10) with an electronic circuit and including longitudinal sides having cooling tabs standing approximately perpendicular to the printed circuit board; shoulders extending along the longitudinal sides and advantageously provided on housing side walls so that the cooling frame rests on the shoulders and projects laterally over the printed circuit board; ridges extending along the longitudinal sides and advantageously provide on housing side walls, each of these ridges being located above one of the shoulders to form a groove therebetween; and leaf springs fixed to the longitudinal sides of the cooling frame. The leaf springs are located in the grooves and designed to provide a contact between the cooling frame and the shoulders to facilitate heat transfer between the cooling frame and the shoulders.

In comparison, the housing in accordance with this invention, has the advantage that the cooling frame has large areas for fixing power components, from which the thermal conduction paths to the diecast housing are very short. Due to the planar contact of the cooling frame to the housing, the heat is easily conducted away and dissipated, so that heat accumulation is avoided. The housing in accordance with this invention is thus suitable for circuits with a large number of power components with correspondingly high thermal output. The cooling frame is of a simple construction, so that its manufacture does not require any cost-intensive manufacturing stages.

The arrangement of the power components on the cooling frame and the fixing of the cooling frame to the printed circuit board, also confer the advantage that assembly can be automated and that only one soldering process is required to create the solder connections. Furthermore, so-called PCB panels can be utilised, on which several cooling frames can be accommodated and simultaneously conveyed over a soldering bath. After soldering, the individual printed circuit boards with the attached cooling frames are broken out or punched out of the PCB panels. Manufacture is thus particularly economical. Moreover the design of the cooling frame and the housing in accordance with the invention avoids additional sealing points, through which dust and moisture could penetrate into the interior of the housing.

In a preferred embodiment of the invention the cooling frame is provided with means for thermally conductively conducting an electronic component to it. This means for thermally conductively connecting is designed to provide a better contact between the cooling tab and the electronic component to facilitate heat transfer from the electronic component to the cooling frame and can be a spring clip.

BRIEF DESCRIPTION OF THE DRAWING

The objects, features and advantages of the present invention will now be illustrated in more detail by the following detailed description, reference being made to the accompanying drawing in which:

FIG. 1 is a partially top plan, partially cross-sectional view through a housing according to the invention with a cooling frame;

FIG. 2 is a cross-sectional view through the housing shown in FIG. 1; and

FIG. 3 is a detailed side view of a fixing element from the housing shown in FIG. 1.

DETAILED DESCRIPTION OF THE PREFERRED EMBODIMENTS

FIG. 1 shows a printed circuit board 10 which has an electronic circuit, not shown here. The electronic circuit is, in particular, a control electronic circuit for a motor vehicle engine. A closed cooling frame 11, which essentially lies parallel to the surface of the printed circuit board and preferably consists of a sheet metal punching, is fixed to the printed circuit board 10 above its top surface. The cooling frame is of rectangular shape, and on a front face 12 and its longitudinal sides 13, 14 it has a partially L-shaped cross section. The front face 12 and the longitudinal sides 13 and 14 comprise the cooling tabs 15 to 17 respectively and legs extending from them. The cooling tabs 15–17 of the front face 12 and longitudinal sides 13 and 14 are perpendicular to the surface of the printed circuit board, and are formed, for example, by bending up inner frame sections designed for that purpose. They serve as a mounting region for power elements 20 which require cooling. The legs of the cooling frame which lie parallel to the surface of the printed circuit board project laterally beyond the printed circuit board 10.

For fixing the printed circuit board 10 onto the cooling frame 11, retaining tongues 21 pointing into the frame interior with threaded holes 22 are arranged on the frame section lying opposite the front face 12, and holes 23 in the front face of the cooling frame. Fixing is by means of screws 24, 26, with spacers 25 being inserted at the fixing points between the cooling frame 11 and the printed circuit board 10. As an alternative to the method of fixing described above, the retaining tongues 21 can be bent downwards at right angles and, at a predetermined distance, bent again parallel to the printed circuit board, towards the interior of the frame, thus dispensing with the spacers 25. Furthermore, the connection between the cooling frame and the printed circuit board can alternatively be made with spring catches or with rivets.

The power components 20 are connected to the printed circuit board via connecting leads 28. The rear faces, which serve to dissipate the heat, rest against the cooling tabs 15-17 which stand perpendicular to the printed circuit board. With metal spring clips 29, which are supported on the rear faces of the cooling tabs and on the front faces of the power components, they are pressed firmly against the cooling tabs in order to enable good heat transfer.

On the front face 12 of the cooling frame 11, a connector plug 30 with a frame 31, contacts 32 and connecting leads 33, is fixed by the screws 26 in the holes 23, with the cooling frame and the printed circuit board. The connecting leads 33 of plug 30 are firmly connected with the printed circuit board 10. For this purpose, the cooling frame has in its front face 12 two right-angled cut-outs 35, 36, adjoining one another, with the first cut-out, on the frame exterior, being wider than the connector plug 30, and extending so far in depth that there remains sufficient frame area around the holes 23 for attachment. The adjoining frame cut-out 36 has a width corresponding approximately to the interior width of the crown-shaped frame 31, and extends in the direction of the frame interior so far that sufficient space is created for passing connecting leads 33 through to the printed circuit board 10.

On the plug housing 30, a front plate 37 with a crown-shaped opening 38 is fixed in a suitable manner so that the contacts 32 project into the opening 38. By a seal 39 inserted between plug housing 30 and front plate 37, the housing interior is protected against the penetration of dust and moisture.

The assembled modular unit of printed circuit board, cooling frame, plug contact strip and front plate is pushed into a box-shaped metal container 41 which is open at one front face. On each of the longitudinal side walls 42, 43 of the housing, a shoulder 44, 45 is formed, on which the cooling frame legs 13, 14, which project laterally over the printed circuit board, rest. Above these, on its side walls 42, 43, the container 41 has narrow long ridges 47, 48 which do not touch the cooling frame and which together with the shoulders 44, 45 form a groove 52, 53.

Leaf springs 49, 50, are fixed, for example by riveting, onto the upper faces of the cooling frame legs 13, 14 which rest on the shoulders of the housing. The leaf springs 49, 50 as well as the cooling frame legs 13, 14 each have a hole 13A, 14A, 49A, 50A on the side facing away from the housing opening. When the cooling frame is pushed into the housing between shoulders 44, 45, and ridges 47, 48, a strong pressure is exerted by the leaf springs 49, 50, pressing the cooling frame against the housing shoulders. This enables good heat transfer.

The container 41 and the front plate 37 are connected to one another by means of screws, rivets or clips, and a seal 51 inserted between the housing edge and the front plate prevents the penetration of dirt and moisture.

The rear of the container 41 can be provided with brackets 71 for mounting in a motor vehicle.

While the invention has been illustrated and embodied in a housing for an electronic circuit with improved heat dissipation means, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims.

1. Housing for an electronic circuit, said housing comprising a cooling frame (11) having means for attachment (23, 24) of a printed circuit board (10) with an electronic circuit, said cooling frame (11) including longitudinal sides (13, 14) having cooling tabs (15-17) standing approximately perpendicular to the printed circuit board (10); housing shoulders (44, 45) extending along the longitudinal sides, said cooling frame (11) projecting laterally over the printed circuit board (10) and resting on said shoulders (44, 45); housing ridges (47, 48) extending along the longitudinal sides, each of said ridges (47, 48) being located above one of the shoulders (44, 45) to form a groove (52, 53) therebetween; and leaf springs (49, 50) fixed to the longitudinal sides (13, 14) of the cooling frame (11) so as to be positioned in the grooves, said leaf springs (49, 50) being structured to provide a contact between the cooling frame and the shoulders to facilitate heat transfer between the cooling frame and the shoulders.

2. Housing as defined in claim 1, further comprising at least one means for thermally conductively connecting an electronic component (20) to one of the cooling tabs (15-17), said at least one means for thermally conductively connecting being structured to provide contact between said cooling tab and said electronic component (20) to facilitate heat transfer from the electronic component to the cooling frame.

3. Housing as defined in claim 2, wherein said at least one means for thermally conductively connecting comprises a spring clip (29), and further comprising means for connecting the electronic component electrically to the printed circuit board.

4. Housing as defined in claim 1, further comprising longitudinal side walls (42, 43) on which said shoulders (44, 45) and ridges (47, 48) are formed.

5. Housing as defined in claim 4, further comprising means for mounting in a motor vehicle, said means for mounting including brackets (71) connected to the longitudinal side walls (42, 43).

* * * * *